United States Patent [19]
Murakami et al.

[11] Patent Number: 5,429,519
[45] Date of Patent: Jul. 4, 1995

[54] CONNECTOR EXAMINING DEVICE

[75] Inventors: Makoto Murakami, Kanazawa; Michimasa Noro; Takao Ito, both of Matsuzaka, all of Japan

[73] Assignee: Sumitomo Wiring Systems, Ltd., Japan

[21] Appl. No.: 114,087

[22] Filed: Aug. 31, 1993

[30] Foreign Application Priority Data

Sep. 3, 1992 [JP] Japan .................. 4-236142

[51] Int. Cl.6 .......................................... H01R 13/62
[52] U.S. Cl. ..................................... 439/310; 439/488
[58] Field of Search ............ 439/310, 296, 259, 261, 439/342, 372, 482, 912, 488, 489; 324/158 F, 538

[56] References Cited

U.S. PATENT DOCUMENTS

| | | | |
|---|---|---|---|
| 4,230,985 | 10/1980 | Makrone et al. | 439/310 |
| 4,658,212 | 4/1987 | Ozawa et al. | 324/158 F |
| 4,820,183 | 4/1989 | Knapp et al. | 439/310 |
| 4,902,968 | 2/1990 | Sugimoto | 324/158 F |
| 5,131,851 | 7/1992 | Billger et al. | 439/310 |

FOREIGN PATENT DOCUMENTS

| | | |
|---|---|---|
| 2-56786 | 12/1990 | Japan . |
| 4-23391 | 4/1992 | Japan . |
| 2169153 | 7/1986 | United Kingdom ............... 439/310 |

Primary Examiner—David L. Pirlot
Assistant Examiner—Hien D. Vu
Attorney, Agent, or Firm—Beveridge, DeGrandi, Weilacher & Young

[57] ABSTRACT

A connector examining device, in which a retainer for attaching a terminal within a housing can be pushed into the housing simultaneous with an examination of a connector. When a lever is pulled up, a cam comes in contact with a trailing end surface of a detector portion. This allows the detector portion to slide toward a connector receiving portion. After the detector portion is in contact with the connector receiving portion, the connector receiving portion and the detector portion together are further displaced. At this time, a retainer pusher, fixed to a base pushes into the housing the retainer temporarily engaged with the housing of the connector held by the connector receiving portion. Thus, the retainer and the terminal within the housing are engaged with one another, and the terminals are engaged with the housing.

6 Claims, 18 Drawing Sheets

F I G. 18
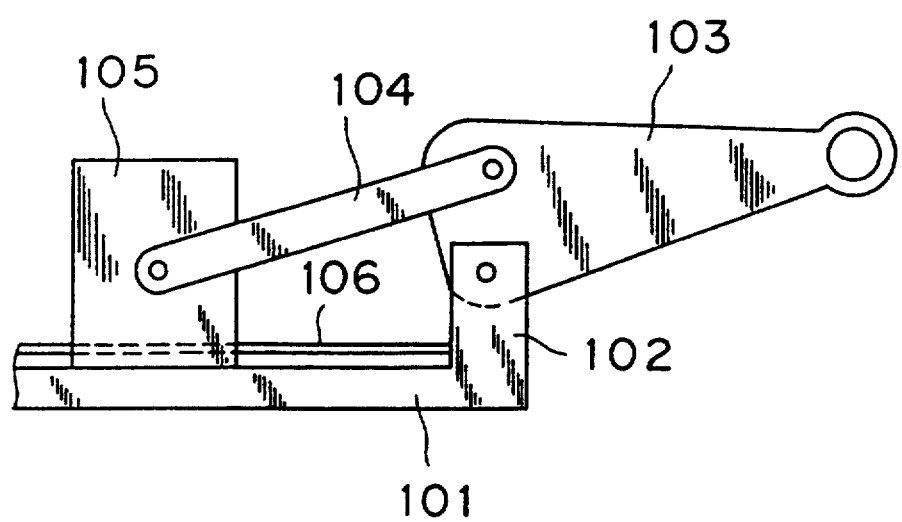

CONNECTOR EXAMINING DEVICE

BACKGROUND OF THE INVENTION

1. Field of the Invention

The present invention relates to a connector examining device for examining attachment conditions of terminals of connectors interconnecting wire harnesses or electrical equipments used in vehicles and the like.

2. Description of the Related Art

For wire harnesses used for wiring of an electrical equipment in vehicles, a connector is used for interconnecting wire harnesses or connecting a wire harness with an electrical equipment. The connector generally has a housing formed of synthetic resin and female or male terminals accommodated by terminal containers formed in the housing. The terminals are engaged with the housing in the so-called housing lance system. When housings of a female connector and a male connector are engaged with each other, the female and male terminals are regulated to attain electrical connection.

The housing lance system is a technology according to which an elastic engagement arm integral with the housing projects toward the inner space of the terminal container, and the engagement arm is engaged with an aperture or an abutment of an electric contact portion of the terminal so as to prevent the terminal from slipping out. In the course of inserting the terminal into the housing, the engagement arm comes in contact with the terminal and is elastically transformed. When the terminal is perfectly inserted, the engagement arm restores its original shape and engages with an aperture or an abutment of the terminal. Thus, perfectly inserting the terminal in the housing, the engagement of the terminal is automatically attained.

However, the engagement arm cannot be formed so large, and hence, repetitive attachment/detachment operation causes the male and female connectors to be damaged, and eventually the terminal may drop out of the housing.

In recent years, a connector having a double engagement arrangement has been widely used. Such connector has an engagement member engaging with the terminal. The engaging member is fitted in the housing from its side after the terminal is inserted so as to attain an extra engagement of the terminal in addition to the housing lance system. Such a connector is disclosed, for example, in Japanese Examined Patent Publication No. 23391/1992.

The connector disclosed therein has a through-hole formed at a side of the housing, into which an engagement member is inserted. The engagement member is put under a temporary engagement in such a retracted position that allows insertion of the terminal before it is inserted in the housing. After the terminal is inserted in the housing, the engagement member is pushed into it to attain the double engagement.

In this arrangement, the engagement member is temporarily engaged with the housing in advance, and therefore, the housing and the engagement member can substantially be handled as one element. Hence, inventory management and the like can be advantageously simplified.

For the connector having the double engagement arrangement as mentioned above, however, an operation of inserting the terminal in the housing and an operation of pushing the engagement member into the housing must be conducted. Then, in course of producing a large amount of wire harnesses, the pushing operation of the engagement member may or the insertion of the engagement member may be imperfect.

Additionally, a stroke length of the engagement member between a position of the temporary engagement and a position where the member is completely pushed is at most about a size of the terminal container, and therefore, it is difficult to determine if the operation of pushing the engagement member has been perfectly conducted. Furthermore, a connector without perfect double engagement is not reliable in the engagement of the terminal, and accordingly, a wire harness is not reliable.

At the final stage of production of the wire harness, a conduction check of the connector is normally conducted. The connector conduction check is performed to check if a terminal is inserted well in the housing, or if a terminal is crimped well to an electric wire. If the terminal is not inserted in the housing, the terminal is inserted in an inappropriate position, or the terminal is imperfectly crimped, an electrical equipment for an automobile causes malfunctions. Thus, the conduction check is essential in producing the wire harness.

An examination device for the connector conduction check has a connector receiving portion for holding a housing and a detector portion provided opposed to the connector receiving portion. The detector portion is provided with detectors to be conductive with terminals within the housing. For example, the connector receiving portion is fixed while the detector portion is slidably attached so that is can be displaced close to or apart from the connector receiving portion.

When the detector portion is displaced close to the connector receiving portion with the housing being attached to the connector receiving portion, the terminals within the connector housing and the detectors provided in the detector portion respectively come in contact with one another, and electric conduction is obtained between them. If the terminal is not inserted in the housing or the terminal is not crimped well to an electric wire, it is checked that the conduction is in a bad condition. Thus, conditions of attachment of the terminal, crimping of the terminal, and the like can be checked depending upon if conduction is obtained between the detector and the terminal when the detector portion is close to the connector receiving portion.

Japanese Examined Patent Publication No. 56786/1990 discloses a technology which employs the connector examining device as stated above to detect imperfect insertion of the engagement member. According to the technology, a detecting unit for detecting a level difference of the engagement member from a surface of the housing is provided with a connector receiving portion.

The detecting unit is, for example, implemented by an arrangement where a detection pin protruding/retracting is provided with the connector receiving portion at a position opposed to the engagement member. If the engagement member is completely pushed into the housing, it never protrudes from the surface of the housing, and a displacement of the detection pin is small. If the engagement member is inserted imperfectly, however, it protrudes from the surface of the housing, and the displacement of the detection pin is large.

Thus, by such arrangement where the greatly displaced detection pin lights a lamp, for example, the examiner can learn that the insertion of the engagement member is imperfect.

In the above-mentioned prior art technology, however, if it is detected that the insertion of the engagement member is imperfect, the examiner has to detach the housing from the connector receiving portion, push the engagement member into the housing, and then attach the housing to the connector receiving portion again to renewedly check the connector. Thus, the prior art technology as mentioned above has a disadvantage that an operation in the process of the conduction check is complicated, and the productivity of the wire harness is necessarily degraded.

SUMMARY OF THE INVENTION

It is an object of the present invention to provide a connector examining device which can simplify a checking operation and enhance certainty of insertion of an engagement member.

The connector examining device of the present invention is used to check a connector in which the engagement member temporarily engaged with a housing is pushed into the housing, and the engagement member and a terminal are engaged with each other within the housing to attach the terminal to the housing. The connector examining device has a connector receiving portion for holding the connector and a detector portion opposed to the connector receiving portion. In the detector portion, a detector corresponding to the terminal of the connector to be checked is projected toward the connector receiving portion. The connector receiving portion and the detector portion can be relatively displaced close to or apart from each other.

Thus, putting the connector receiving portion and the detector portion close to each other, the terminal of the connector and the detector come in contact with one another, and electric conduction is obtained between them. If the conduction is not obtained, there is an imperfect condition such as imperfect insertion of the terminal into the housing of the connector or bad wiring connection to the terminal. Thus, it is checked if the terminals are attached well and the like by putting the connector receiving portion and the detector portion close to each other and checking conduction/nonconduction between the detector and the terminal.

In the present invention, the engagement member temporarily engaged with the housing is pushed into the housing by a pusher when at least one of the connector receiving portion and the detector portion is displaced for the above-mentioned check. Specifically, the pusher comes in contact with the engagement member of the connector held by the connector receiving portion and is displaced relative to the connector receiving portion. During the relative displacement of the pusher relative to the connector receiving portion, the engagement member is pushed into the housing. As a result, the terminal and the engagement member are engaged with each other, and the attachment of the terminal is attained.

Thus, according to the present invention, the engagement member to make an engagement of the terminal is pushed into the housing simultaneous with the conduction check. Hence, even if the insertion of the engagement member is imperfect, there is no need of renewedly performing the pushing operation of the engagement member into the housing. Thus, the checking operation is considerably facilitated.

If the engagement member is inserted into the housing simultaneous with the examination of the connector, the pushing operation of the engagement member before the examination can be omitted, and hence, productivity of the wire harness and the like are considerably enhanced.

These and other objects, features and effects of the present invention will become more fully apparent from the following detailed description when taken in conjunction with the accompanying drawings.

BRIEF DESCRIPTION OF THE DRAWINGS

FIG. 18 is an elevational view showing a mechanism where a link mechanism causes a checking element to slide.

DESCRIPTION OF THE PREFERRED EMBODIMENTS

Figure 1:
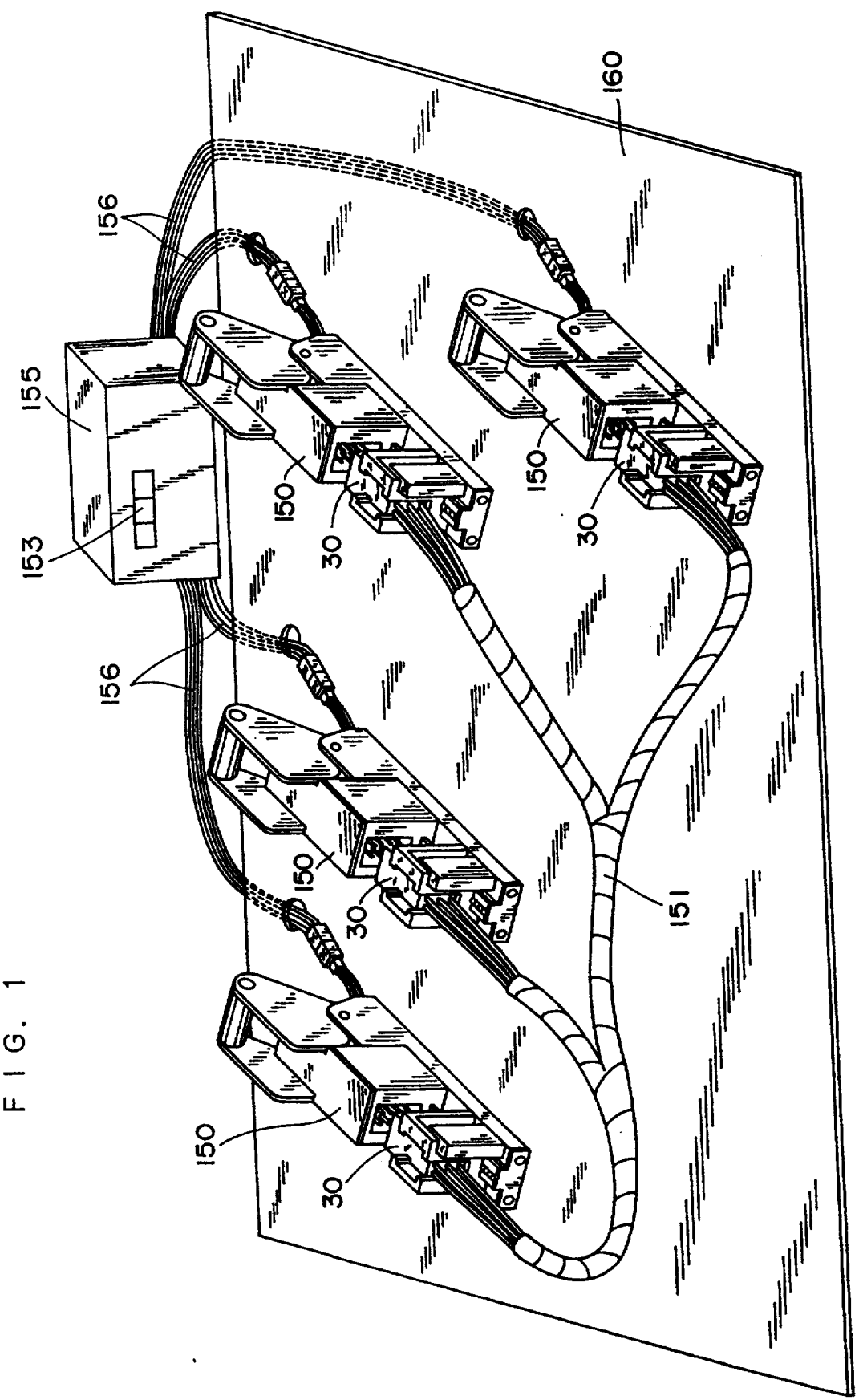
FIG. 1 is a perspective view showing a connector examining device of an embodiment of the present invention in operative state.

FIG. 1 is a perspective view showing a connector examining device of a preferred embodiment of the present invention in operative condition. A connector examining device 150 is used in its fixed position on a drawing board 160 for examination. Wire harness 151 constructed by grouping a plurality of covered electric wires together is set on the drawing board 160. A circuit of the wire harness 151 is drawn on a surface of the drawing board 160 (not shown in FIG. 1). Connector examining devices 150 are disposed in positions corresponding to connectors 30 attached to ends of the wire harness 151, respectively.

Each connector examining device 150 is connected via wires 156 to a conduction checking unit 155. The conduction checking unit 155 performs conduction examination based upon circuit information about the wire harness 151 to examine, for example, whether the terminals of the connectors 30 are well attached. An indicator 153 indicates GOOD or NO GOOD for the conduction examination.

Figure 2:
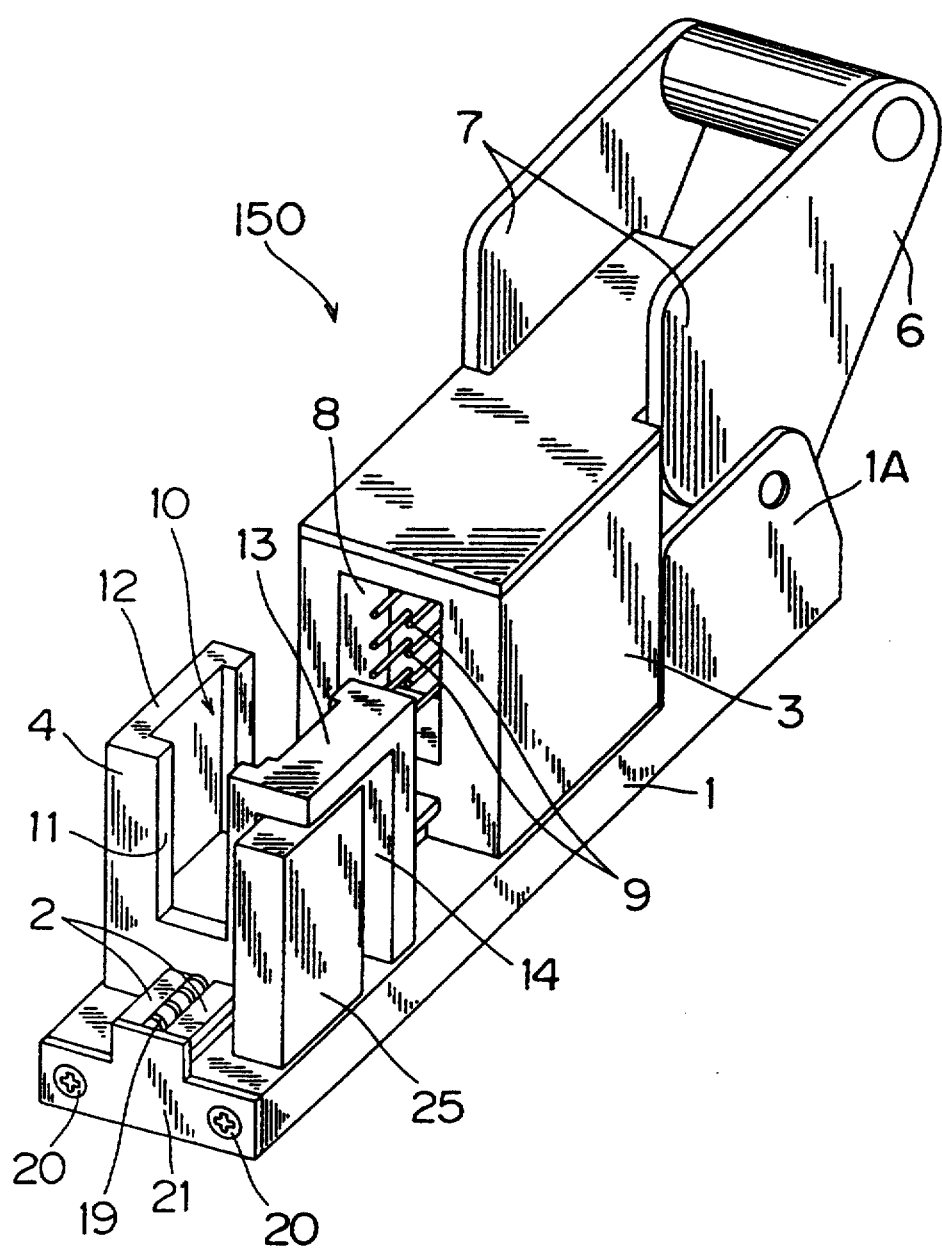
FIG. 2 is a perspective view showing a basic structure of the connector examining device of the embodiment.

FIG. 2 is a perspective view showing a structure of the connector examining device 150. A pair of slide rails 2 are provided with a base fixable 1 fixed to the drawing board 160. A detector portion 3 and a connector receiving portion 4 are slidably fitted on the slide rails 2. Close to one end of the detector portion 3, a lever mounting portion 1A erects contiguous with the base 1. A lever 6 is attached to the lever mounting portion 1A so as to pivot about an axis which is parallel with the base 1 and orthogonal to the slide rails 2. A cam 7 extending toward the detector portion 3 is formed integral with the lever 6. The cam 7 comes in contact with the rear portion of the detector portion 3.

A recess 8 is formed at an end surface of the detector portion 3 distal from the lever 6. Within the recess 8, a plurality of detectors 9 are disposed in parallel in positions opposite to terminals of a connector (not shown) held by a connector receiving portion 4. The detectors 9 are elastically urged toward the connector receiving portion 4 by coil springs not shown.

The connector receiving portion 4 has a U-shaped cross section perpendicular to the slide rails 2 and also has a receiving space 10 for holding a connector to be checked. At the rear end of the connector receiving portion 4, a notch 11 is formed, in which electric wires drawn from the connector are inserted. A side wall 13 (a pair of side walls 12 and 13 are located along the slide rails 2 of the connector portion 4) contains a window 14 to provide for communication between spaces inside and outside of the receiving space 10.

A retainer pusher 25 is fixed to the base 1 in a position opposed to the window 14.

Figure 3:
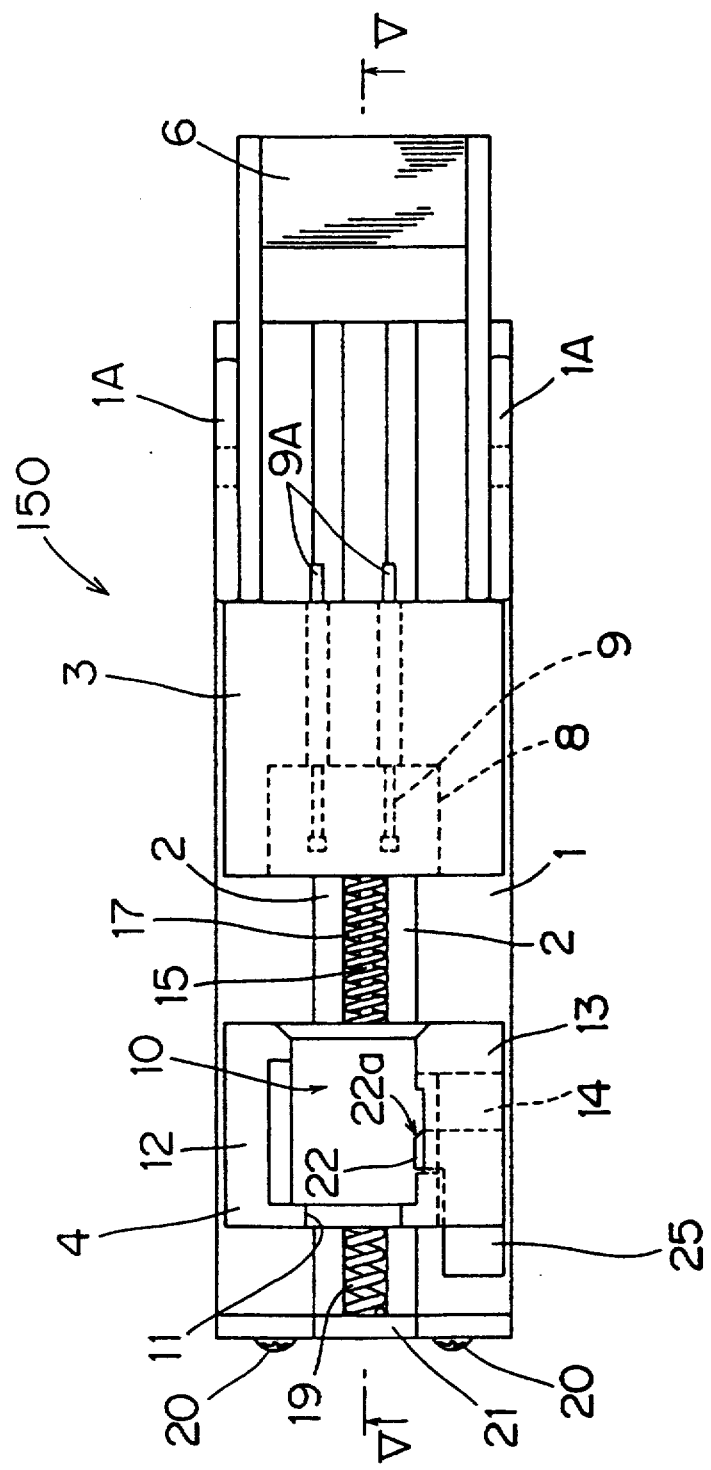
FIG. 3 is a plan view showing the connector examining device.
Figure 4:
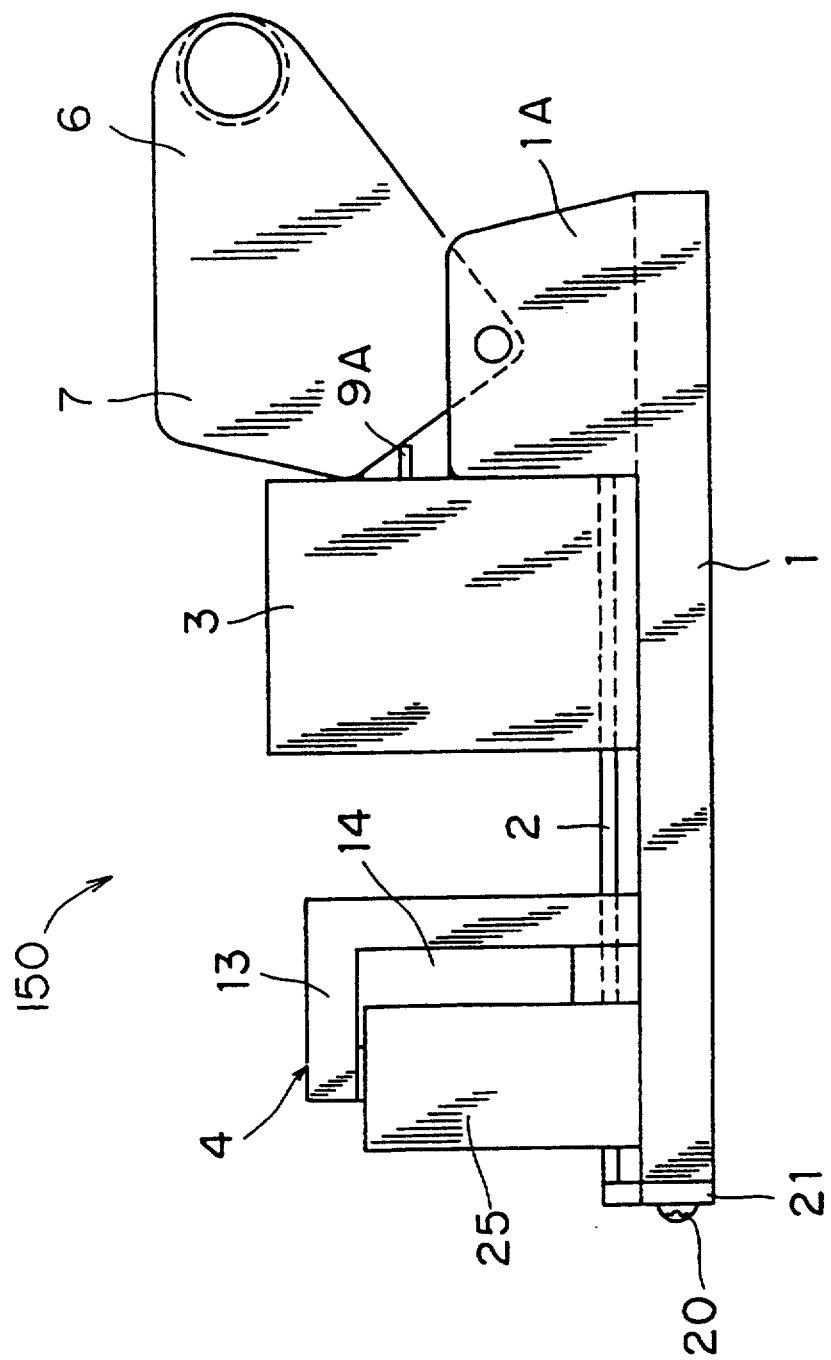
FIG. 4 is an elevational view showing the connector examining device.
Figure 5:
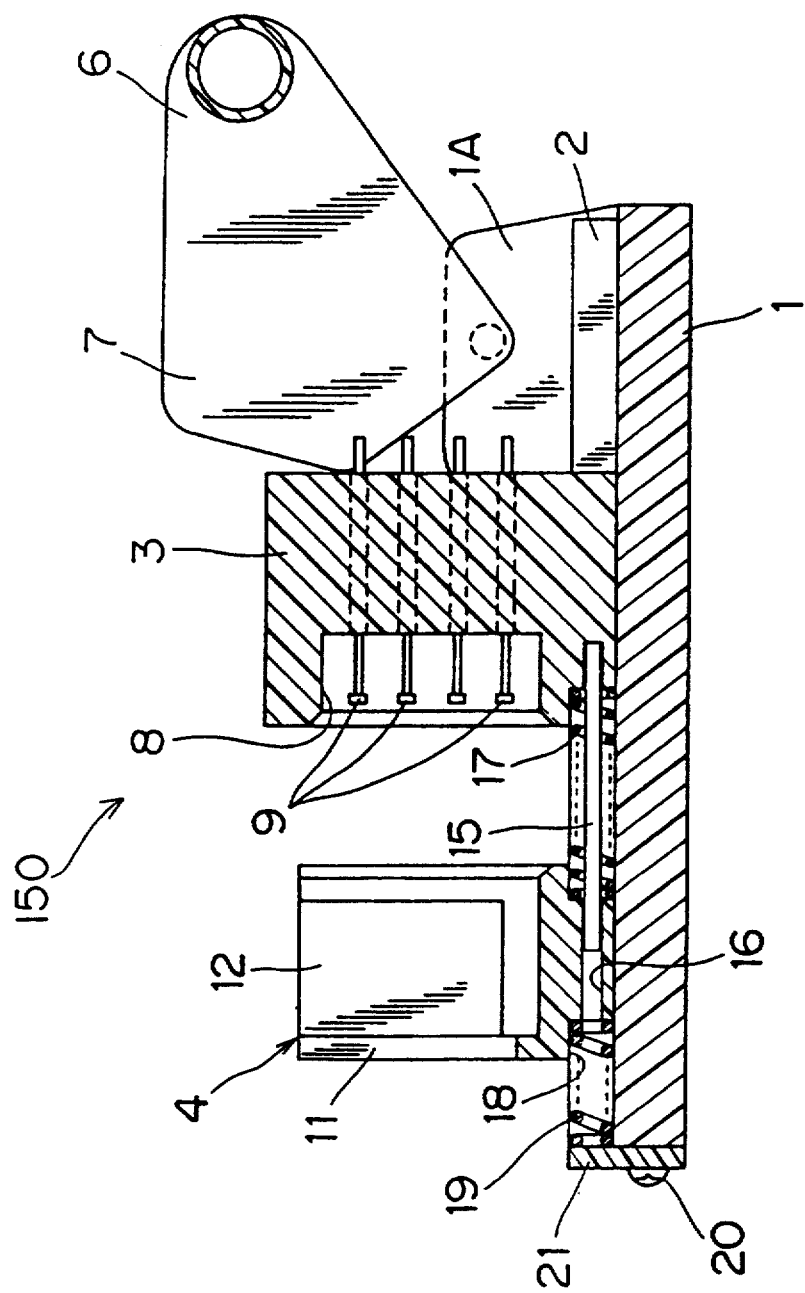
FIG. 5 is a sectional view taken along the line V—V of FIG. 3.

FIG. 3 is a plan view showing the above-mentioned connector examining device, FIG. 4 is an elevational view thereof, and FIG. 5 is a sectional view taken along the line V—V of FIG. 3. A guide rod 15 is fixed to the detector portion 3 in a position between the pair of slide rails 2, extending toward the connector receiving portion 4. The guide rod 15 is inserted in a through-hole 16 formed in parallel with the slide rails 2 at the bottom of the connector receiving portion 4. A coil spring 17 used as a first elastic urging means is wound on the guide rod 15 to urge the detector portion 3 toward the lever 6.

An indent 18 is formed at a bottom part of the connector receiving portion 4 distal from the detector portion 3 between the pair of the slide rails 2. One end of a coil spring 19 serving as a second elastic urging means is disposed between the pair of the slide rails 2 and is fitted in the indent 18. The other end of the coil spring 19 is in contact with an end plate 21 fixed to an end surface of the base 1 distal from the lever 6 by a bolt 20. The coil spring 19 provides an elastic force larger than that of the coil spring 17, and hence, the coil spring 19 is slightly compressed while the coil spring 17 is considerably compressed.

The retainer pusher 25 fixed to the base 1 has a projection 22 which is fitted in the window 14 formed in the side wall 13 of the connector receiving portion 4. The projection 22 slightly projects into the receiving space 10 from the inside surface of the side wall 13 of the connector receiving portion 4. When the connector receiving portion 4 slides along the slide rails 2, the projection 22 of the retainer pusher 25 changes its relative position within the window 14. In other words, the projection 22 is displaced relative to the connector receiving portion 4. The projection 22 has a tapered portion 22A on the edge close to the detector portion 3.

Terminals 9A electrically connected to the detectors 9, respectively, project at an end surface of the detector portion 3 distal from the connector receiving portion 4. The terminals 9A are connected to the examining unit 155 by wirings (not shown).

Figure 6:
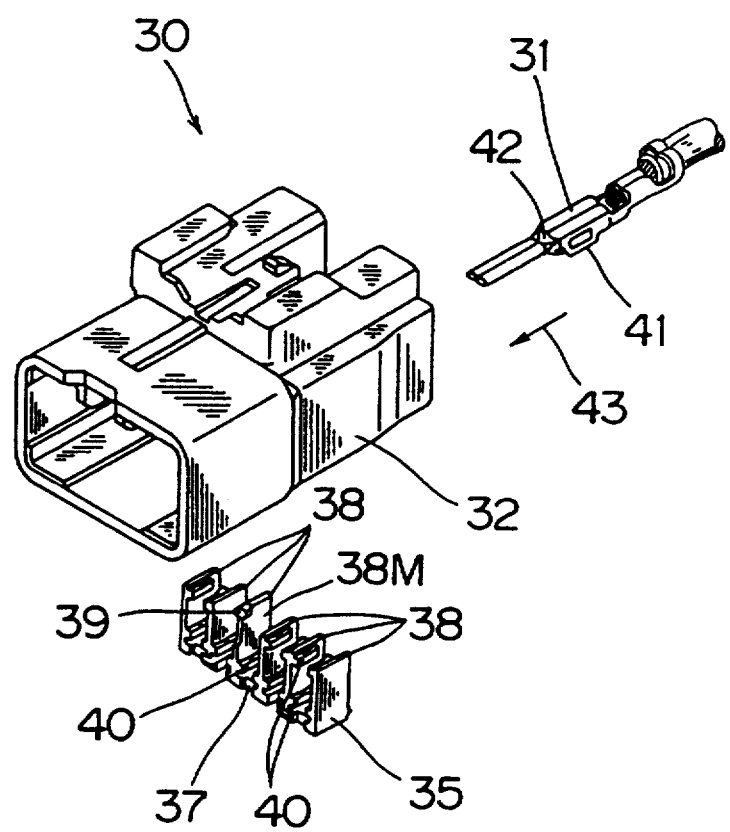
FIG. 6 is an exploded perspective view showing a configuration of a connector to be checked.
Figure 7:
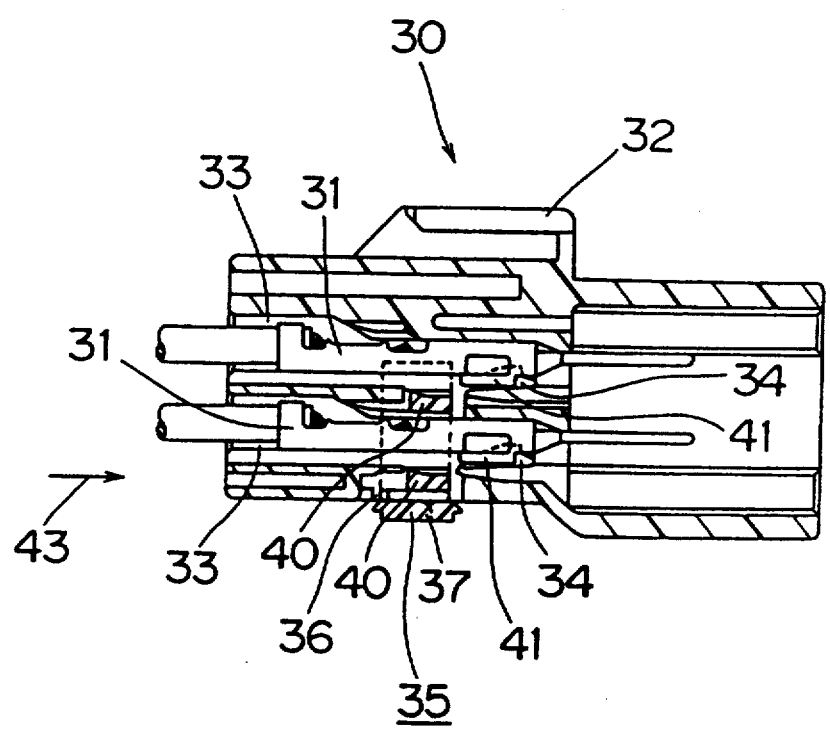
FIG. 7 is a sectional view of the connector.

FIG. 6 is an exploded perspective view showing a configuration of a connector to be checked by the connector examining device having a configuration as mentioned above, and FIG. 7 is a cross sectional view showing the connector assembled. FIGS. 6 and 7 show structures of a male connector 30 which comprises a male housing 32 retaining a male terminal 31 therein.

The housing 32 is a resin molded product having a plurality of inner terminal containers 33. A flexible engagement arm 34 integral with the housing 32 projects within each of the terminal containers 33. When the terminal 31 is inserted along an arrow 43, the terminal 31 comes in contact with the engagement arm 34 in the course of attachment to cause elastic transformation of the engagement arm 34. When the terminal 31 is completely inserted, the engagement arm 34 recovers to engage with a bore 42 in the terminal 31. In this way, engagement of the terminal 31 is accomplished by a so-called housing lance system.

After the terminal 31 is inserted, a retainer 35 used as an engagement member is inserted. Specifically, a through-hole 36 is formed to provide communication between the inside of the connector housing 32 and the outside. The comb-shaped retainer 35 is fitted in the through-hole 36. The retainer 35 consists of a joint 37 and a plurality of locking pieces 38 protruding therefrom. A center locking piece 38M has a temporary engagement portion 39 at its distal end and an engagement portion 40 at its proximate end. The remaining locking pieces 38 have the respective engagement portions 40 at both distal and proximate ends.

The retainer 35 is temporarily engaged in a temporary locking position as shown in FIG. 7 before the terminal 31 is inserted into the housing 32. In this state, the engagement portions 40 are retracted so as to allow the terminal 31 to be inserted in the housing 32. When the retainer 35 is in the temporary locking position, the temporary engagement portion 39 at the distal end of the center locking piece 38M is engaged with the housing 32 to prevent the retainer 35 from slipping off.

After all terminals 31 to attach to the housing 32 are inserted therein, the retainer 35 is pushed into the housing 32. The engagement portion 40 of each locking piece 38 is engaged with a flap 41 of each of the terminals 31. Thus, the engagement of the terminals 31 by the retainer 35 is enforced in addition to the above-mentioned housing lance system to attain the double engagement.

Under the circumstance where the retainer 35 is perfectly attached to the housing 32, a surface of the joint 37 of the retainer 35 aligned in the same plane with a surface of the housing 32 or in an inner position from the surface of the housing 32.

Figure 8:
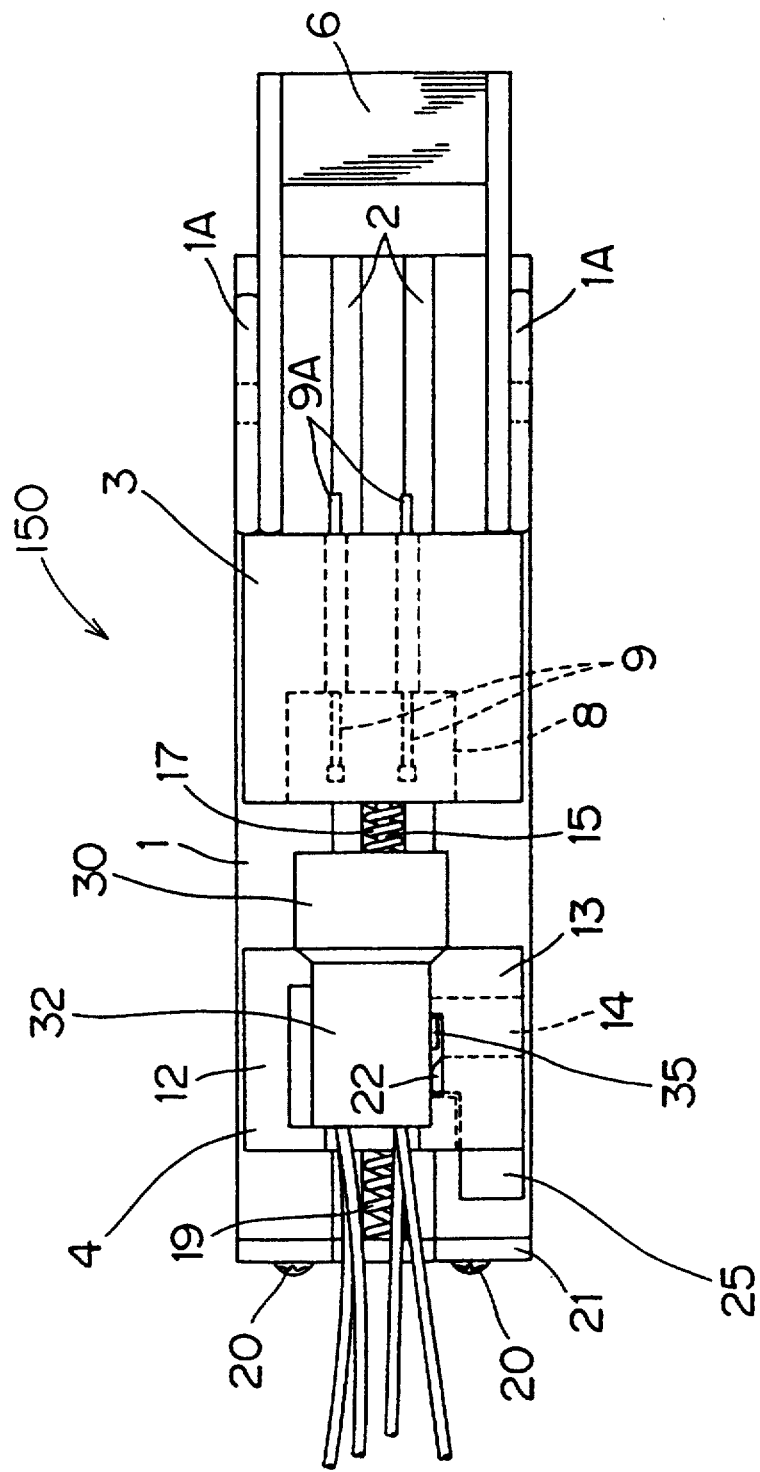
FIG. 8 is a plan view showing the connector being attached in position.
Figure 9:
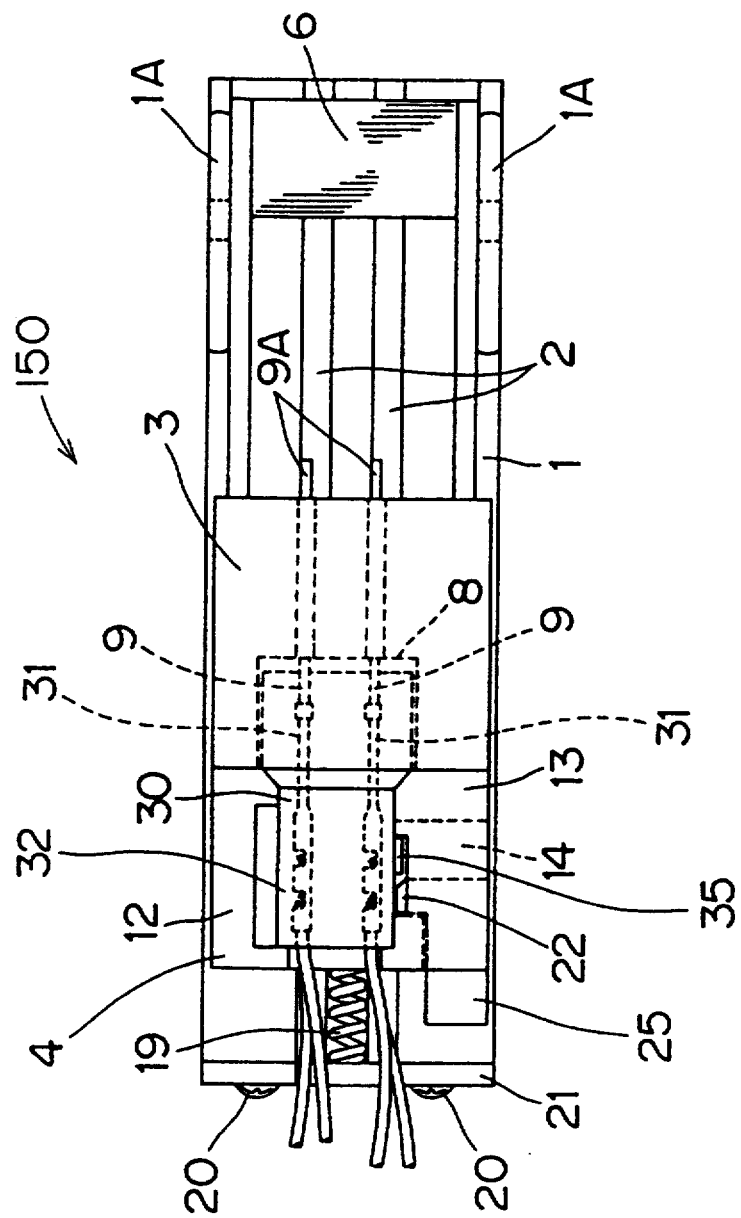
FIG. 9 is a plan view showing terminals being in contact with detectors.
Figure 10:
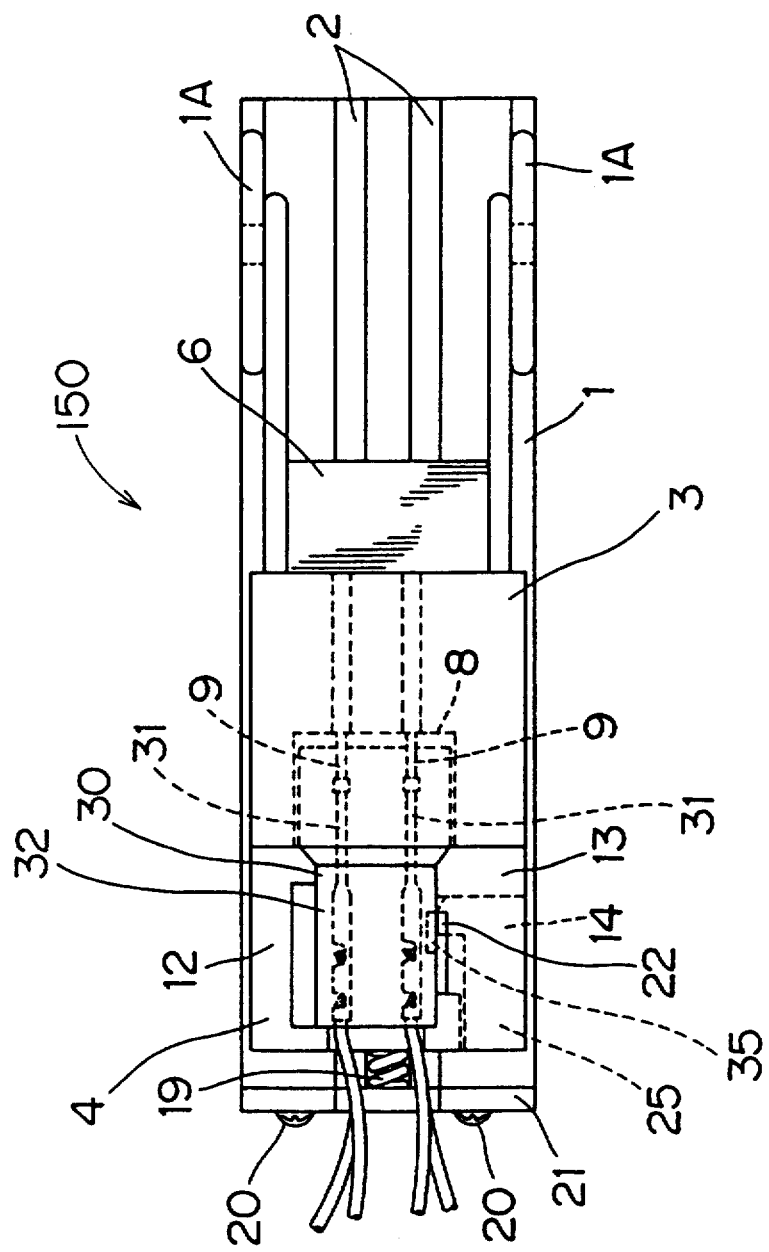
FIG. 10 is a plan view illustrating an operation of inserting a retainer.

FIGS. 8, 9 and 10 are diagrams illustrating an operation during the examination. It is now assumed that the retainer 35 is imperfectly inserted in the housing 32 and therefore the joint 37 of the retainer 35 protrudes from the surface of the housing 32.

The connector 30 is fitted in the receiving space 10 of the connector receiving portion 4 with the retainer 35 put against the side wall 13. The projection 22 of the retainer pusher 25 is in contact with the surface of the housing 32.

An examination operator first attaches the connector 30 to the connector receiving portion 4 and then pulls the lever 6 up. An intermediate state at this time is shown in FIG. 9; that is, as the lever 6 is pulled up, the detector portion 3 is displaced against the pushing force by the coil spring 17 to allow the connector 30 to fit in the recess 8, and the detectors 9 come in contact with the distal ends of the terminals 31. When the lever 6 is pulled up against the pushing force of a coil spring (not shown) which urges the detectors 9, the detectors 9 are depressed to cause the detector portion 3 and the connector receiving portion 4 are in contact in their opposed ends with each other until the state shown in FIG. 9 is accomplished.

In this state, the pushing force of the coil spring urging the detectors 9 brings about pressure between the detectors 9 and the terminals 31 and conduction between them. In this way, it is examined whether the terminals 31 are properly attached, whether the terminals 31 are well crimped to electric wires, and so forth.

Until the detector portion 3 and the connector receiving portion 4 are in contact with each other as in the state of FIG. 9, the coil spring 19 is hardly compressed to retain the connector receiving portion 4 at almost the initial position. This is because repelling force of the coil spring 19 is greater than that of the coil spring 17, as mentioned above.

When the lever 6 is further pulled up from the state of FIG. 9, the coil spring 19 is then compressed to cause the detector portion 3 and the connector receiving portion 4 together to be displaced as a unity. At this time, since the retainer pusher 25 is fixed, the retainer 35 comes in contact with the projection 22 of the retainer pusher 25 to push the retainer 35 into the housing 32, as shown in FIG. 10. Thus, the retainer 35 is completely inserted in the housing 32, and this effects a double engagement of the terminals 31.

Figure 11:
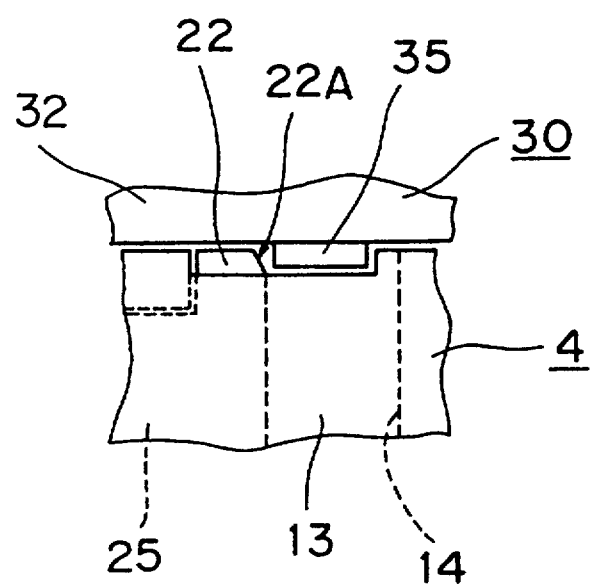
FIG. 11 is an enlarged plan view showing a configuration of a main portion.

As shown in an enlarged diagram of FIG. 11, the tapered portion 22A is formed at an edge of the projection 22 of the retainer pusher 25 close to the detector portion 3. Thus, sliding the connector receiving portion 4, the projection 22A can smoothly push the retainer 35 into the housing 32.

As has been described, according to the connector examining device of the present embodiment, manipulating the lever 6, the detectors 9 of the detecting portion 3 come in contact with the terminals 31 to examine, for example, if the terminals 31 are attached well. During the examination, the connector receiving portion 4 is displaced relative to the retainer pusher 25 fixed to the base 1, and in the course of the displacement, the retainer 35 is pushed into the connector housing 32 by the retainer pusher 25.

After the conduction check to the connector 30, it is assured that the retainer 35 is perfectly inserted in the housing 32. In the above mentioned prior art, detection of the imperfect insertion of the retainer during the connector conduction check is always followed by the annoying work of detaching the connector, inserting the retainer, and then conducting a connector conduction check again. On the contrary, such operations are utterly needless in this preferred embodiment. Thus, a manufacturing process of a wire harness is simplified and its productivity is enhanced.

The connector conduction check is an essential process in fabricating a wire harness, and therefore it is not always needed to perfectly insert the retainer 35 in the housing 32 in advance of before the conduction check. Hence, the operation of inserting the retainer may be omitted, and instead, the insertion of the retainer 35 may be performed simultaneous with the conduction check to the connector 30. This leads to simplification of the wire harness fabricating process, and thus, productivity can be more enhanced.

Figure 12:
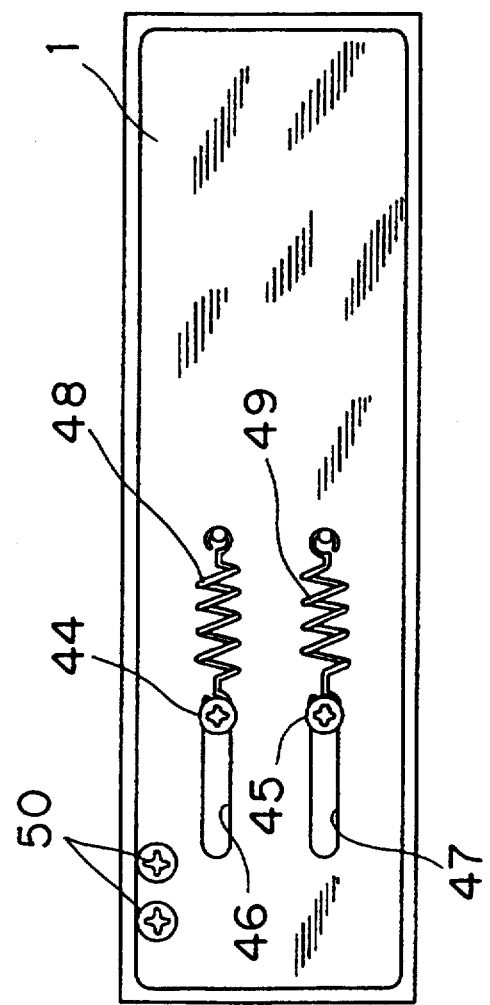
FIG. 12 is a bottom plan view showing a structure of a variation of the above embodiment.

FIG. 12 depicts a variation of the present invention, which presents a bottom view showing the examining device. In this variation, long apertures 46, 47 are formed in the base 1 so that a pair of bolts 44, 45 fixed to the connector receiving portion 4 can be slide along through the apertures. Coil springs 48, 49 are attached to the pair of bolts 44, 45 at the bottom side of the base 1. The coil springs 48, 49 urge the connector receiving portion 4 toward the detector portion 3 with force larger than the elastic force of the coil spring 17. The coil springs 48, 49 are used instead of the coil spring 19 in the previous embodiment. In this varied embodiment, the coil spring 19 and the end plate 21 are omitted. Reference numeral 50 denotes a bolt used to fix the retainer pusher 25 to the base 1.

Figure 13:
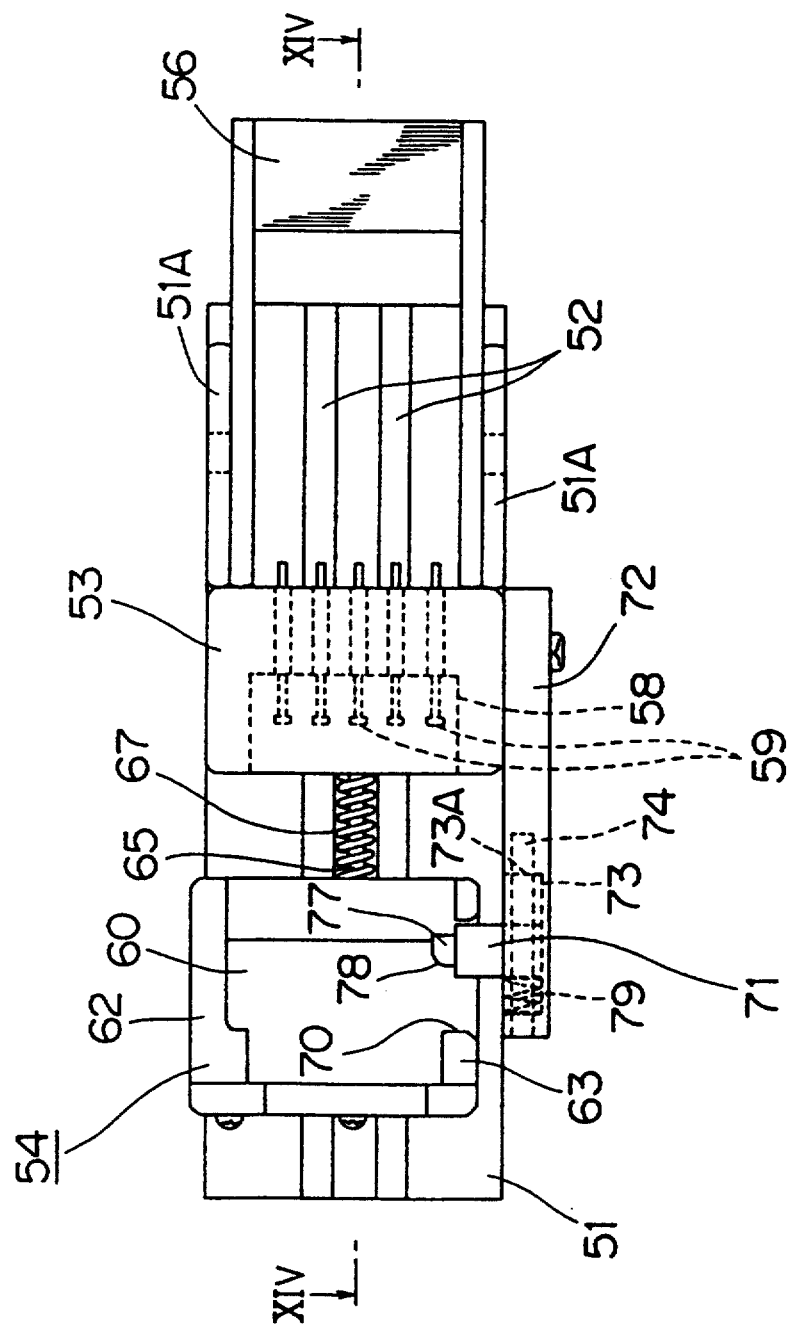
FIG. 13 is a plan view showing a configuration of a connector examining device of another embodiment of the present invention.
Figure 14:
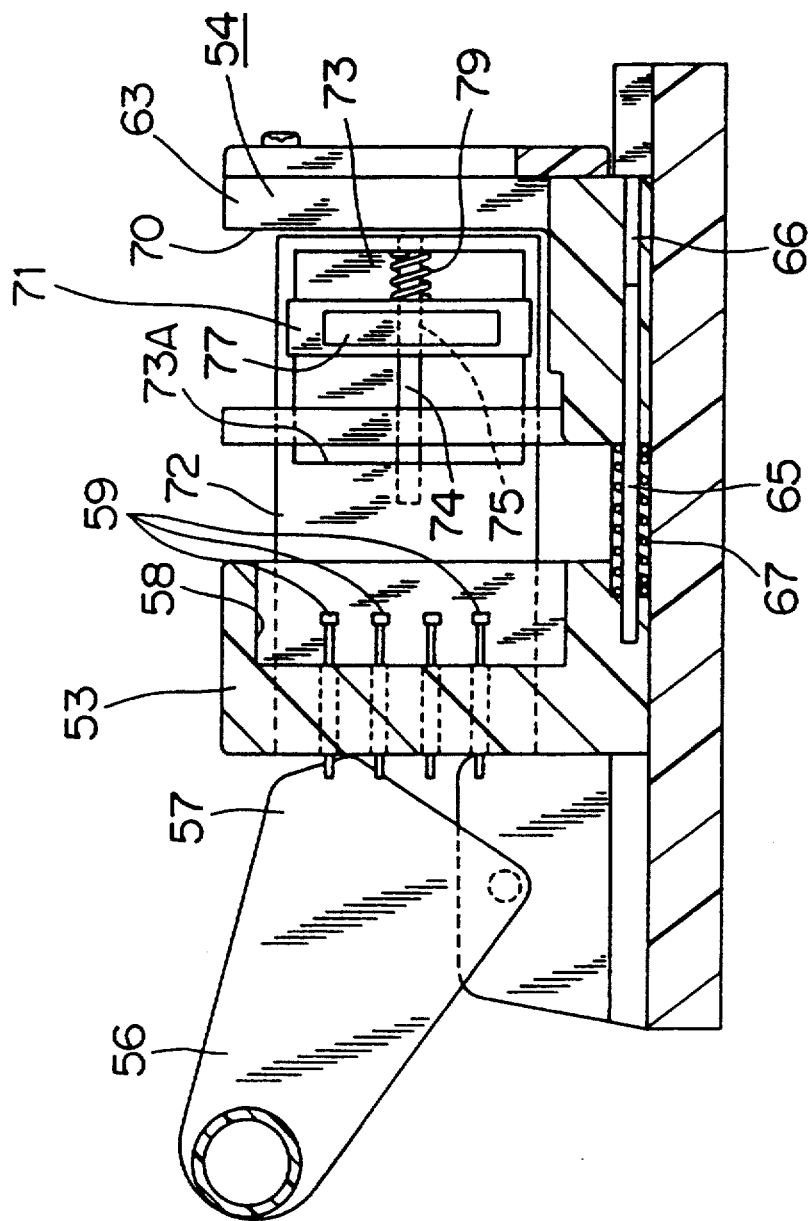
FIG. 14 is a sectional view taken along the line XIV—XIV of FIG. 13.

FIG. 13 is a plan view showing a structure of a connector examining device of another preferred embodiment according to the present invention, and FIG. 14 is a sectional view taken along the line XIV—XIV of FIG. 13. The connector examining device includes a base 51 fixed to a drawing board for examination, and a detector portion 53 is provided slidable on a pair of rails 52 formed on a surface of the base 51. A connector receiving portion 54 for holding a connector to be checked is fixed to the base 51 in a specified position on the slide rails 52.

The base 51 is provided with a lever mounting portion 51A at its end close to the detector portion 53. A lever 56 is pivotaly attached to the lever mounting portion 51A. A cam 57 for displacing the detector portion 53 toward the connector receiving portion 54 is formed integral with the lever 56.

The detector portion 53 has a recess 58 which is formed at a portion facing the connector receiving portion 54, and a plurality of detectors 59 are disposed in parallel within the recess 58. A guide rod 65 is fixed at the lower part of the detector portion 53, projecting toward the connector receiving portion 54, and it is inserted through a through-hole 66 formed in the connector receiving portion 54. The coil spring 67 is wound round the guide rod 65 to urge the detector portion 53.

The connector receiving portion 54 is formed of resin molded product having an almost U-shaped cross section perpendicular to the slide rails 52 and also has a receiving space 60 for holding a connector to be checked. A pair of side walls 62, 63 are formed along the slide rails 52, and the side wall 63 is provided with a U-shaped notch 70. A retainer pusher 71 is fitted in the notch 70.

The retainer pusher 71 is fitted in a recession 73 which is formed in a guide plate 72 fixed to the detector portion 53. A guide rod 74 extends in parallel with the slide rails 52 in the recession 73 of the guide plate 72. A coil spring 79 is wound on the guide rod 74 to urge the retainer pusher 71 toward the detector portion 53.

The guide rod 74 passes through a through-hole 75 formed in the retainer pusher 71. Thus, the retainer pusher 71 slides along the guide rod 74. Displacement of the retainer pusher 71 is restricted to a range within the notch 70. Displacement of the retainer pusher 71 toward the detector portion 53 is regulated by an end surface 73A of the recession 73 close to the detector portion 53.

The retainer pusher 71 has a projection 77 protruding into the receiving space 60 of the connector receiving portion 54. The projection 77 extends in a direction orthogonal to the base 51 and has a tapered portion 78 at an edge distal from the detector portion 53.

Figure 15:
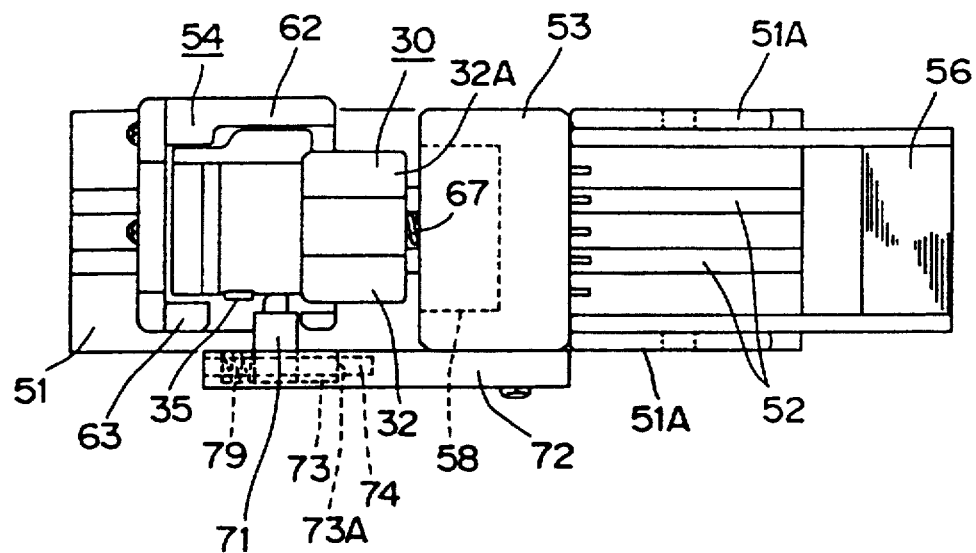
FIG. 15A is a plan view showing a connector being attached in position.
FIG. 15B is an elevational view showing the connector being attached in position.
Figure 15:
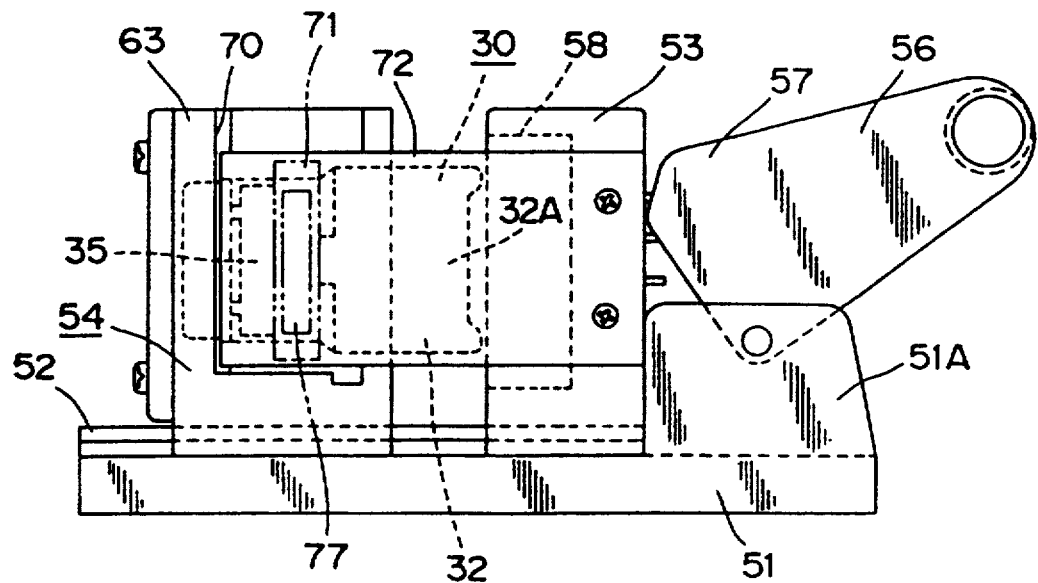

FIG. 15A is a plan view showing a state where a connector 30 is attached to the connector receiving portion 54, and FIG. 15B is an elevational view thereof. The connector 30 is configured as illustrated in FIGS. 6 and 7, and like reference numerals denote corresponding parts in FIGS. 15A and 15B to those in FIGS. 6 and 7.

The connector 30 attached has its retainer 35 imperfectly inserted, and the retainer 35 protrudes from a surface of the housing 32. At a time immediately after the connector 30 is attached, the retainer pusher 71 is in position close to the center of the recession 73 formed in the guide plate 72 due to the repelling force of the coil spring 79. This position is equivalent to the position around an end of the notch 70 close to the detector portion 53 in the state as shown in FIGS. 15A and 15B where the lever 56 is brought down. The position of the retainer pusher 71 is also closer to the detector portion 53 than the retainer 35 of the connector 30 attached to the connector receiving portion 54.

When the connector 30 is attached to the connector receiving portion 54, the projection 77 of the retainer pusher 71 is in contact with the surface of the housing 32.

When the lever 56 is pulled up from the state as shown in FIGS. 15A and 15B, the detector portion 53 slides towards the connector receiving portion 54. Consequently, terminals (not shown) in the connector 30 and detectors (not shown) disposed in parallel in the recess 58 of the detector portion 53 come in contact with each other to provide electrical conduction between them. No conduction in this state means a default such as imperfect insertion of the terminals, imperfect crimping of the terminals to electric wires, etc. In this way, the conduction check is effected.

When the lever 56 is further pulled up after the terminals and the detectors are in contact with each other, the tapered portion 78 of the projection 77 provided in the retainer pusher 71 comes in contact with the retainer 35 protruding from the housing 32. When the detector portion 53 slides from this state, the retainer pusher 71 is relatively displaced toward the detector portion 53 through a guide of the guide rod 74 within the recession 73 in the guide plate 72. Relative displacement of the retainer pusher 71 within the recession 73 is stopped when the retainer pusher 71 comes in contact with the end surface 73A of the recession 73 close to the detector portion 53.

When the lever 56 is pulled up after the retainer pusher 71 is in contact with the end surface 73A of the recession 73, the retainer pusher 71 is about to move over the retainer 35. At this moment, the projection 77 applies force to the retainer 35 to push the retainer 35 into the housing 32.

Figure 16:
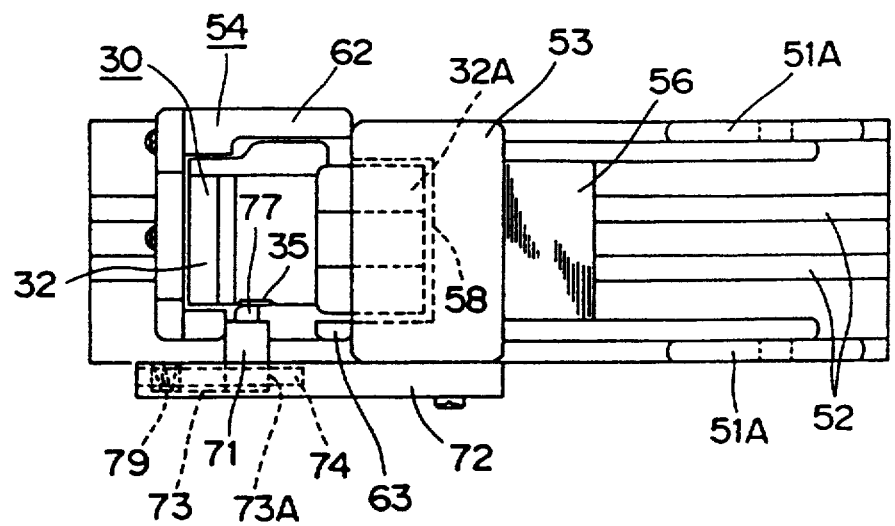
FIG. 16A is a plan view illustrating an operation of inserting a retainer.
FIG. 16B is an elevational view illustrating the operation of inserting the retainer.
Figure 16:
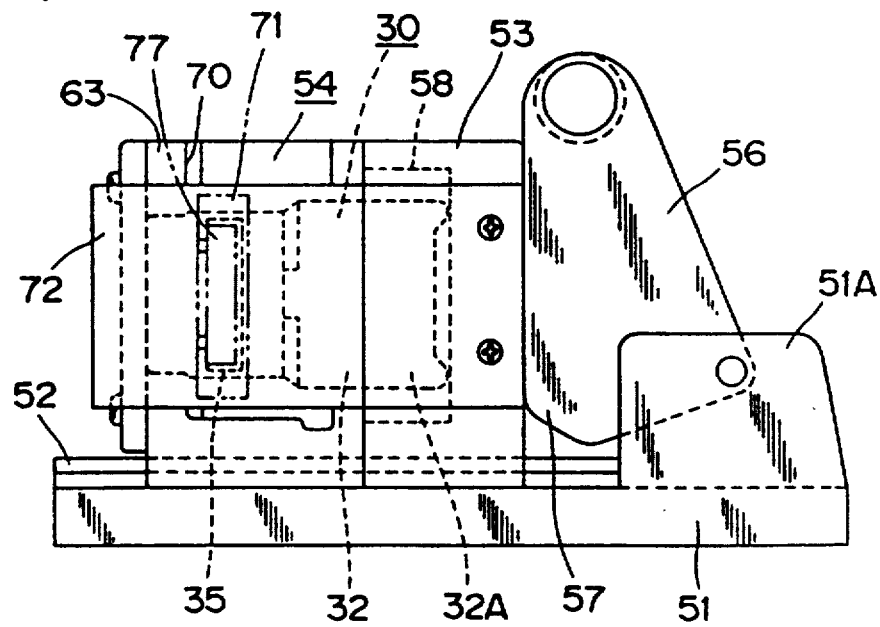

The resultant state where the insertion of the retainer 35 is attained is shown in FIGS. 16A and 16B. FIG. 16A is a plan view and FIG. 16B is an elevational view thereof.

As has been described, also in this embodiment, pulling up the lever 56 for the conduction check, not only the conduction check but the perfect insertion of the retainer 35 under its imperfectly inserted state can be attained. In this way, the similar effect to the case as explained in the previous embodiment can be attained with one operation for the conduction check because the insertion of the retainer can be simultaneously performed.

In this embodiment, the retainer pusher 71 is slidably attached to the guide plate 72 because an end 32A of the housing 32 has an outwardly expanding shape.

More specifically, fixing the retainer pusher 71 in contact position with the end surface 73A of the recession 73, sliding the detector portion 53 enables the terminals and detectors first to come in contact with each other and the retainer pusher 71 thereafter to be opposed against the retainer 35. However, the end 32A of the housing 32 of the connector 30 to be checked is expanded, and when the retainer pusher 71 is positioned against the edge 73A of the recession 73, the projection 77 cannot protrude toward the receiving place 60 sufficiently to be in contact with the retainer 35. This after all disables the retainer pusher 71 from being in contact with the retainer 35, that is, from pushing the retainer 35 into the housing 32.

To avoid the inconvenience as mentioned above, at the initial state the retainer pusher 71 must be in a position retracted from the end 32A of the housing 32. As a means for that, the above-mentioned structure where the retainer pusher 71 is slidably mounted relative to the guide plate 72 is provided.

Thus, if the connector to be checked has a cross section roughly uniform in shape throughout, for example, the retainer pusher 71 may be fixed relative to the slide plate 72 fixed to the detector portion 53.

Figure 17:
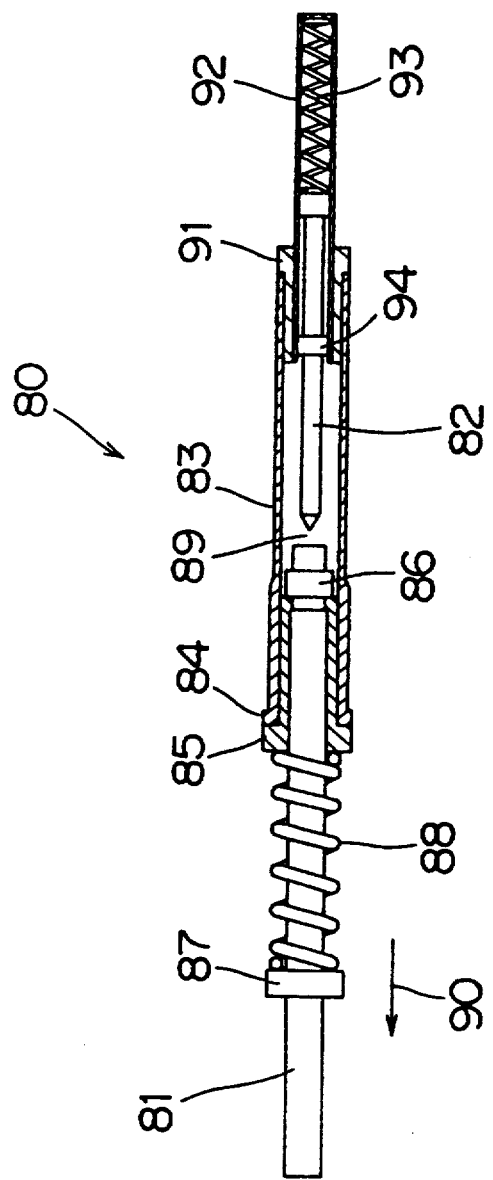
FIG. 17 is a sectional view showing a configuration of a detector used in another embodiment of the present invention.

FIG. 17 is a diagram illustrating a structure of a connector examining device of still another embodiment of the present invention, which is a sectional view of a detector. This embodiment will be described with reference to FIGS. 1 to 12 again which are used for the description of the first preferred embodiment.

In this embodiment, detectors 80 configured as in FIG. 17 are installed instead of the detectors 9 in the first embodiment which are disposed in parallel with each other in the recess 8 of the detector portion 3. The detector 80 is of a two-probe type which has a first probe 81 provided opposed to the connector receiving portion 4 and in contact with the terminal of the connector and a second probe 82 provided in series with and just after the first probe 81.

A flange 84 is formed at a leading end of a metal pipe 83 inserted to the detector portion 3, and the first probe 81 is inserted in the metal pipe 83 from the end where the flange 84 is formed. Around a tailing portion of the first probe 81, a boss 85 engaged with the metal pipe 83 is slidably fitted thereon. A stopper 86 is fixed at a tailing end of the first probe 81 extending behind the boss 85 to prevent the boss 85 from dropping out. A flange 87 is formed at a portion close to a leading portion of the first probe 81, and a coil spring 88 is wound on the first probe 81 between the flange 87 and the boss 85 to urge the first probe 81 in a direction of arrow 90.

At a tailing end of the metal pipe 83, a boss 91 made of insulator such as synthetic resin is fitted therein. A fine metal pipe 92 is fixed to the boss 91, having a coil spring 93 therein. The second probe 82 is slidably inserted in the metal pipe 92. A flange 94 being frictionally in contact with the inner surface of the metal pipe 92 is formed in the middle of the extension of the second prove 82.

When the stopper 86 fixed to the tailing end of the first probe 81 is in contact with a retailing end of the boss 85, there lies a gap 89 between the first probe 81 and the second probe 82.

When the connector 30 to be checked is attached to the connector receiving portion 4 and the lever 6 is pulled up to displace the detector portion 3 toward the connector receiving portion 4, first the terminal 31 within the housing 32 comes in contact with the first probe 81. The detector portion 3 is further slid from this state, the coil spring 88 is compressed until the gap 89 gets shorter, and a tailing end of the first probe 81 and a leading end of the second probe 82 come in contact with each other to further compress the coil spring 93. Thus, the coil spring 88 applies sufficient pushing pressure to make the terminal 31 and the first probe 81 electrically conductive while the coil spring 93 applies sufficient pushing pressure to make the first and second probes 81, 82 electrically conductive.

In this way, if a terminal (not shown) of a lead connected to a conduction checking unit (not shown) is connected to the fine metal pipe 92, it can be detected that an electric path from the terminal 31 through the first probe 81, the second probe 82 and the flange 94 to the metal pipe 92 is formed.

The coil springs 88 and 93 exert their spring force upon the terminal 31 in contact with the leading end of the first probe 81. Hence, with the imperfect insertion condition of the terminal 31 and the imperfect engagement of the terminal 31 in the above-mentioned housing lance system, the terminal 31 drops out of the housing 32 before the retainer 35 is inserted therein. When the terminal 31 drops out of the housing 32, the operator interrupts the pivotal operation of the lever 6 to renewedly check the connector after inserting the terminal 31 dropped out.

When the terminal 31 does not drop out, the operator further pivots the lever 6. This allows the end surface of the detector portion 3 to be in contact with the end surface of the connector receiving portion 4, and both of them together slides. In the course of sliding, the retainer 35 comes frictionally in contact with the retainer pusher 25 fixed to the base 1. In this way, the retainer 35 is perfectly inserted in the housing 32.

Thus, in this embodiment, besides the conduction check and the insertion of the retainer, imperfect insertion of the terminal 31 can be detected.

This embodiment can be easily applied to the structure of the second preferred embodiment as shown in FIGS. 13 to 16, where the detector 80 as shown in FIG. 17 may be used instead of the detector 59.

Although the preferred embodiments of the present invention have been described, the present invention should not be limited to those embodiments. For example, the lever integral with the cam takes the place of sliding the detector portion on the base in the first, second and third preferred embodiments, but a link mechanism as shown in FIG. 18 may be applied to those embodiments instead of the cam mechanism.

In an arrangement employing the link mechanism, a lever mounting portion 102 erects from one end of a base 101, and a lever 103 is pivotaly fixed to the lever mounting portion 102. One end of a link 104 is fixed in a position a specified distance away from a rotation axis of the lever 103. The other end of the link 104 is fixed to a detector portion 105. With this arrangement, pulling up or down the lever 103 permits the detector portion 105 to slide along on slide rails 106.

Although the detector portion is generally displaced in the previous embodiments, it is enough to relatively put the detector portion and the connector receiving portion close to or apart from each other. Thus, this may be an arrangement where the connector receiving portion is mainly to be displaced, or an arrangement where both of the portions are simultaneously disposed.

In the above embodiment, moreover, the check of the male connector having the male terminals 31 is illustrated, but a female connector having female terminals can take its place in a similar arrangement to perform the conduction check, the insertion of the retainer, etc.

The disclosure of Japanese Patent Application Serial No. 236142/1992, filed on Sep. 3, 1992, is incorporated herein by reference.

While the preferred embodiments of the present invention have been described, these are examples for setting forth the technical subjects of the present invention and are not to be narrowly taken by way of limitation. The true spirit and scope of the present invention should be defined by the description of the appended claims.

What is claimed is:

1. A connector examining device used to check an electrical connector which has an engagement member that is temporarily engaged with a housing of the connector and is pushable into the housing whereby the engagement member and a terminal within the housing are engaged with each other to attach the terminal to the housing, said examining device comprising:
    a base,
    a connector receiving portion slidably attached to said base to move in a specified direction for holding the connector,
    a detector portion attached to said base in opposition to said connector receiving portion and having a detector which corresponds to the terminal of the connector held by said connector receiving portion, said detector protruding toward said connector receiving portion, and
    a pusher, fixed to said base, for coming into contact with the engagement member of the connector held by said connector receiving portion to push the engagement member into the housing when said connector receiving portion is slidably displaced in said specified direction on said base.

2. A connector examining device according to claim 1,
    wherein said connector examining device checks whether the terminal is attached well based upon whether electric conduction is obtained between the terminal of the connector and said detector when said connector receiving portion and said detector portion are in a position relatively close to each other.

3. A connector examining device according to claim 1, wherein said detector includes
- a first probe for coming into contact with the corresponding terminal,
- a second probe disposed in series to said first probe at a specified interval from said connector receiving portion, and
- means for elastically urging said first and second probes respectively toward said connector receiving portion.

4. A connector examining device according to claim 1, further comprising
- first elastic urging means for elastically urging said connector receiving portion and said detector portion so as to repel from each other, and
- second elastic urging means for elastically urging said connector receiving portion toward said detector portion with force larger than that applied by said first elastic urging means.

5. A connector examining device according to claim 4,
- wherein said detector portion is slidably attached to said base in said specified direction,
- and said detector portion slides toward said connector receiving portion when the connector is examined.

6. A connector examining device according to claim 5,
- wherein said pusher is fixed to said base so that it comes into contact with said engagement member to push it into the housing after the terminal of the connector held by said connector receiving portion and said detector are in contact.

* * * * *